United States Patent
Hirata et al.

(10) Patent No.: US 11,047,376 B2
(45) Date of Patent: *Jun. 29, 2021

(54) ACTUATOR SUPPORT STRUCTURE AND PUMP DEVICE

(71) Applicant: Murata Manufacturing Co., Ltd., Nagaokakyo (JP)

(72) Inventors: Atsuhiko Hirata, Nagaokakyo (JP); Yukiharu Kodama, Nagaokakyo (JP); Kenta Omori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 73 days.

This patent is subject to a terminal disclaimer.

(21) Appl. No.: 16/578,438

(22) Filed: Sep. 23, 2019

(65) Prior Publication Data

US 2020/0018303 A1    Jan. 16, 2020

Related U.S. Application Data

(63) Continuation of application No. 15/333,359, filed on Oct. 25, 2016, now Pat. No. 10,465,672, which is a
(Continued)

(30) Foreign Application Priority Data

Apr. 11, 2011  (JP) .............................. JP2011-087475

(51) Int. Cl.
   *F04B 45/047*    (2006.01)
   *F04B 17/00*     (2006.01)
(Continued)

(52) U.S. Cl.
   CPC .......... *F04B 45/047* (2013.01); *F04B 17/003* (2013.01); *F04B 43/0054* (2013.01);
(Continued)

(58) Field of Classification Search
   CPC .... F04B 45/04; F04B 45/047; F04B 43/0027; F04B 43/028; F04B 43/043; F04B 43/046; F04B 2203/0406; H01L 41/0973
(Continued)

(56) References Cited

U.S. PATENT DOCUMENTS

2009/0148318 A1* 6/2009 Kamitani ................ F04B 45/04
                                                        417/413.2

OTHER PUBLICATIONS

Hirata et al., "Actuator Support Structure and Pump Device", U.S. Appl. No. 15/333,359, filed Oct. 25, 2016.

* cited by examiner

*Primary Examiner* — Philip E Stimpert
(74) *Attorney, Agent, or Firm* — Keating & Bennett, LLP (57) ABSTRACT

A piezoelectric pump includes a leaf spring including a disc portion defining an actuator, an outer frame portion defining a housing, and an elastic support portion. The actuator flexurally vibrates from a center portion of a principal surface thereof to an outer periphery thereof. The elastic support portion includes a beam portion and connection portions and elastically supports the disc portion on the outer frame portion. The beam portion extends in a gap between the disc portion and the outer frame portion in a direction along an outer periphery of the disc portion. A first of the connection portions connects the beam portion to the disc portion. Second and third connection portions are offset from the first connection portion and connect the beam portion to the outer frame portion.

14 Claims, 7 Drawing Sheets

Related U.S. Application Data continuation of application No. 13/908,022, filed on Jun. 3, 2013, now Pat. No. 9,506,464, which is a continuation of application No. PCT/JP2012/055179, filed on Mar. 1, 2012.

(51) Int. Cl.
*F04B 43/04* (2006.01)
*H01L 41/09* (2006.01)
*F04B 43/00* (2006.01)

(52) U.S. Cl.
CPC ........ *F04B 43/046* (2013.01); *H01L 41/0973* (2013.01); *F04B 2203/0406* (2013.01)

(58) Field of Classification Search
USPC ............................................ 417/413.1, 413.2
See application file for complete search history.

ACTUATOR SUPPORT STRUCTURE AND PUMP DEVICE

BACKGROUND OF THE INVENTION

1. Field of the Invention

The present invention relates to an actuator support structure that supports an actuator which flexurally vibrates and a pump device that includes the actuator support structure and conveys fluid.

2. Description of the Related Art

A thin pump device has been developed which is used for conveying air for a fuel cell system and other devices, and controls the flow of fluid by using an actuator that flexurally vibrates (e.g., see International Publication No. 2008/069264).

Figure 1:
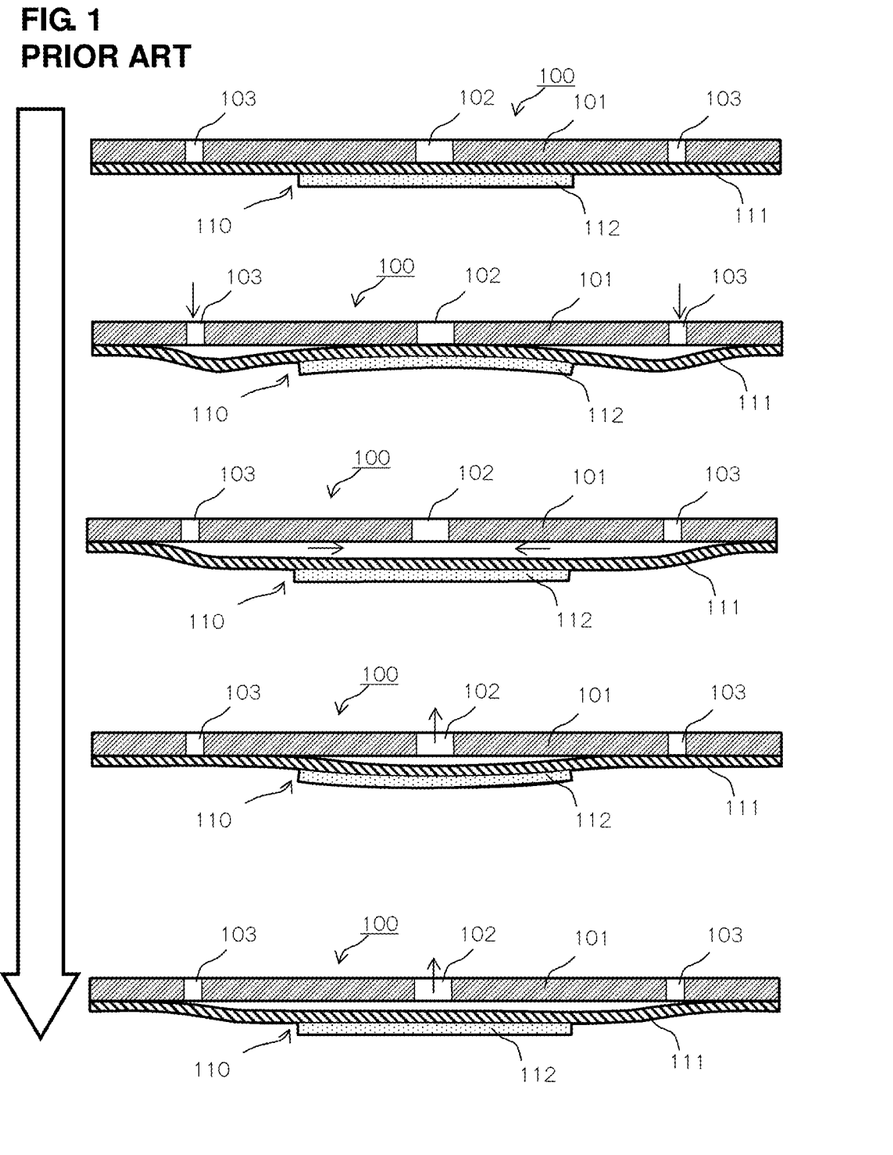
FIG. 1 is a diagram illustrating the configuration of a known pump device and its action.

FIG. 1 is a diagram illustrating an example of an existing pump device and its action.

The pump device 100 includes an actuator 110 including a vibration plate 111 and a piezoelectric element 112 and an opposed plate 101 disposed so as to be adjacent to and opposed to the vibration plate 111. The vibration plate 111 is made of metal and fixed at the entire outer peripheral portion thereof to the opposed plate 101. The piezoelectric element 112 is attached to a center portion of the vibration plate 111. The opposed plate 101 includes a first opening 102 disposed at a position that faces the center of the actuator 110 and a second opening 103 disposed at a position that faces the actuator 110 so as to be positioned outward of the piezoelectric element 112. In this pump device, when a voltage of a predetermined frequency is applied to the piezoelectric element 112, the vibration plate 111 resonates in a third-order resonance mode, and in the vibration plate 111, a portion that faces the first opening 102 and a portion that faces the second opening 103 bend in opposite directions. By repeating this bending, the pump device 100 sucks fluid through one of the first opening 102 and the second opening 103 and discharges the fluid through the other of the first opening 102 and the second opening 103.

There is demand for the size of an electronic apparatus in which a pump device is included to be reduced in size, and for the size of the pump device to be reduced without reducing the pumping power (fluid pressure and flow rate). In addition, for the electronic apparatus, a decrease in a power-supply voltage is also demanded, and for the pump device, a decrease in a drive voltage is also demanded. However, the pumping power of the pump device tends to decrease as the size is reduced or the drive voltage is decreased. Thus, there are limits to the size reduction and the drive voltage decrease.

SUMMARY OF THE INVENTION

Preferred embodiments of the present invention provide a small-sized and low-height pump device having high pumping power and an actuator support configuration that is suitable for such a pump device.

An actuator support structure according to a preferred embodiment of the present invention includes an actuator, a side wall, and an elastic support portion. In addition, a pump device according to a preferred embodiment of the present invention includes an actuator, a housing, and an elastic support portion, and the housing includes a side wall and an opposed wall. The actuator preferably has a plate shape and flexurally vibrates from a center portion of a principal surface thereof to an outer peripheral portion thereof. The side wall surrounds an outer periphery of the actuator. The opposed wall is located so as to be adjacent to and opposed to the principal surface of the actuator and is provided with a flow path hole in a center portion of a region facing the actuator or in the vicinity of the center. A fluid flows in through the flow path hole.

The elastic support portion includes a beam portion, an actuator connection portion, and a side wall connection portion and connects and elastically supports the actuator to the side wall. The beam portion extends in a gap between the actuator and the side wall in a direction along the outer periphery of the actuator. The actuator connection portion connects the beam portion to the actuator. The side wall connection portion is provided in a position that is offset from the actuator connection portion in the direction along the outer periphery of the actuator and connects the beam portion to the side wall.

According to this configuration, the outer peripheral portion of the actuator is connected and elastically supported on the side wall, such as the housing, via the elastic support portion. Thus, the outer peripheral portion of the actuator is not fixed as in the structure shown in FIG. 1, and the outer peripheral portion of the actuator can be displaced. In addition, the beam portion of the elastic support portion extends in the direction along the outer periphery of the actuator and the actuator connection portion and the side wall connection portion are arranged so as to be offset from each other. Thus, the beam portion can be configured in a substantially straight shape or in a substantially circular arc shape, and a sufficient beam portion length can be ensured without folding the beam portion. Therefore, a wide range of beam portion lengths can be used without substantially reducing the size (in area) of the vibration plate.

In the above-described configuration of the pump device, preferably, the beam portion is configured to be connected to the actuator via the actuator connection portion at a position adjacent to a loop, or an anti-node of natural vibrations when the side wall connection portion is a fixing portion, and a natural vibration frequency of the natural vibrations corresponds to a natural vibration frequency of the actuator.

In the above-described configuration, preferably, two of the side wall connection portions are connected to both ends of the beam portion, and the actuator connection portion is connected to a center portion of the beam portion between both ends thereof.

In the above-described configuration, preferably, vibrations of the beam portion accompanying the flexural vibrations of the actuator are vibrations in a first-order resonance mode.

In the above-described configuration of the pump device, preferably, the actuator has a disc shape, for example.

In the above-described configuration of the pump device, preferably, the opposed wall includes a thin portion which is provided on an outer periphery of the flow path hole and capable of flexurally vibrating, and a thick portion which is provided on an outer periphery of the thin portion.

According to various preferred embodiments of the present invention, the outer peripheral portion of the actuator is enabled to be displaced with flexural vibrations, the flexural vibrations of the actuator are prevented from being damped by constraint from the side wall portion, and the amplitude of the flexural vibrations is increased. Since the amplitude of the flexural vibrations of the actuator is increased, desired fluid pressure and flow rate are efficiently obtained in the pump device even when a drive voltage is low.

In addition, a wide range of the beam portion length can be set without substantially reducing the size (in area) of the vibration plate. Thus, various characteristic values, such as the elastic modulus and the resonant frequency of the beam portion, can be arbitrarily set. The larger the area of the vibration plate is, the higher the flow rate can be ensured in the pump device. Moreover, when various characteristic values, such as the elastic modulus and the resonant frequency of the beam portion, can be arbitrarily set, the amplitude of the flexural vibrations of the actuator can be increased by appropriately setting various characteristic values.

Furthermore, if a moment load applied to the elastic support portion during driving is excessively high, the elastic support portion may break. For example, if the beam portion has a configuration that is folded back in a middle portion (e.g., a meandering shape), a moment load is applied to the folded-back portion so as to open the beam portion in opposite directions, and the beam portion is likely to break at that position. For such a problem, in the above-described configuration, the actuator connection portion and the side wall connection portion are configured to be offset from each other. Thus, the beam portion can be configured in a substantially straight shape or in a substantially circular arc shape, the position to which the moment load is primarily applied is limited to the actuator connection portion or the side wall connection portion, and breakage of the beam portion is prevented. By setting the length of connection with the actuator or the side wall to be relatively long, the actuator connection portion and the side wall connection portion can be configured so as to be difficult to break.

The present inventors have discovered that when a state is provided in which the beam portion vibrates in an odd number-order resonance mode with flexural vibrations of the actuator, damping of the flexural vibrations is effectively prevented. Therefore, when the elastic modulus and the resonant frequency of the beam portion are appropriately set and the beam portion is vibrated in an odd number-order resonance mode, the beam portion is configured to be connected to the actuator at a position adjacent to the loop of the resonance of the beam portion. In this state, damping of the flexural vibrations is effectively prevented, and the amplitude of the flexural vibrations is further increased.

Since the beam portion is preferably supported in a double-supported structure, the actuator connection portion provided in the center portion of the beam portion does not deform in a twisting manner, and breakage of the actuator connection portion is prevented.

When the vibrations of the beam portion are in the first-order resonance mode, the vibration amplitude of the beam portion is maximized and damping of the flexural vibrations of the actuator is effectively prevented.

When the actuator has a disc shape, rotationally symmetrical (coaxial) flexural vibrations occur, and thus, an unnecessary gap does not occur between the actuator and the opposed wall in the pump device and the operating efficiency is increased.

Since the thin portion capable of flexurally vibrating is preferably provided in the opposed wall, the thin portion also vibrates with the vibrations of the actuator. Thus, the substantive vibration amplitude is increased and the fluid pressure and flow rate are increased in the pump device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, piezoelectric pumps that include piezoelectric elements will be described as examples of a pump device that includes an actuator support structure according to preferred embodiments of the present invention.

First Preferred Embodiment

First, a schematic configuration of a piezoelectric pump 1 according to a first preferred embodiment of the present invention and its basic pumping action will be described.

Figure 2:
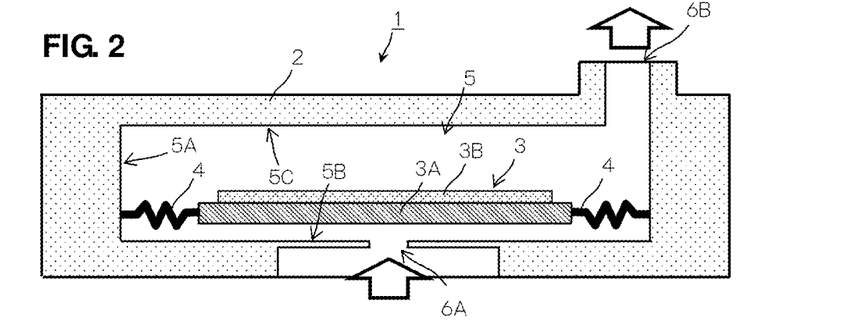
FIG. 2 is a schematic diagram of a piezoelectric pump according to a first preferred embodiment of the present invention.

FIG. 2 is a schematic cross-sectional view of the piezoelectric pump 1 according to the first preferred embodiment of the present invention during non-driving.

The piezoelectric pump 1 includes a housing 2, an actuator 3, and an elastic support portion 4.

The actuator 3 includes a piezoelectric element 3B attached to a vibration plate 3A. In the piezoelectric element 3B, electrode films which are not shown are preferably provided on substantially the entire upper and lower principal surfaces, respectively. The piezoelectric element 3B is configured to extensionally vibrate when, for example, a square-wave or sine-wave drive voltage of about 20 kHz is applied between these electrodes. Because of the configuration of the actuator 3 in which the piezoelectric element 3B is attached to the vibration plate 3A that is a rigid body, rotationally symmetrical (coaxial) flexural vibrations having a vibration direction that corresponds or substantially corresponds to a direction perpendicular or substantially perpendicular to a principal surface direction occur from a center portion of the principal surface to the outer periphery in the actuator 3.

The housing 2 includes, as a flow path, an inner space 5 accommodating the actuator 3 and the elastic support portion 4 and flow path holes 6A and 6B communicating with the inner space 5. The inner space 5 is configured to include a cylindrical side wall 5A, a lower opposed wall 5B provided so as to close a lower opening of the side wall 5A, and an upper opposed wall 5C provided so as to close an upper opening of the side wall 5A. The flow path hole 6A is provided in the vicinity of the center of a region of the lower opposed wall 5B which faces the lower principal surface of the actuator 3. Preferably, the flow path hole 6B is provided at a position outward of a region of the upper opposed wall 5C which faces the upper principal surface of the actuator 3 in the present preferred embodiment.

The elastic support portion 4 connects the outer periphery of the actuator 3 to the side wall 5A and elastically supports the actuator 3 such that the lower principal surface of the actuator 3 is arranged so as to face the lower opposed wall 5B with a small space therebetween or in a contact state during non-driving.

The piezoelectric pump 1 of the present preferred embodiment utilizes the schematic configuration as described above.

Figure 3A:
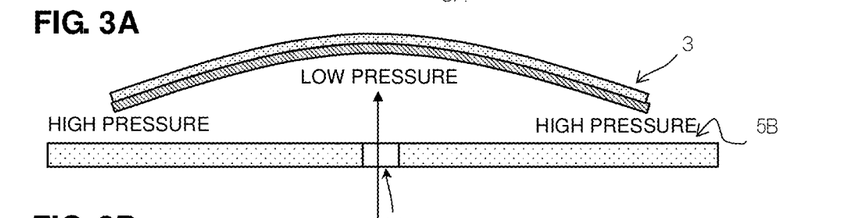
FIG. 3A is a schematic diagram illustrating the principle of action of the piezoelectric pump shown in FIG. 2.
Figure 3B:
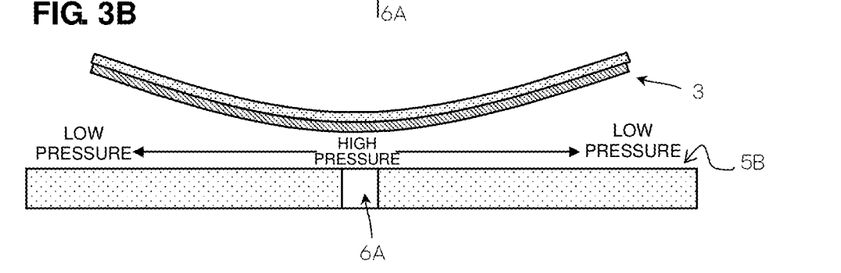
FIG. 3B is a schematic diagram illustrating the principle of action of the piezoelectric pump shown in FIG. 2.

FIGS. 3A and 3B are schematic diagrams illustrating the basic pumping action of the piezoelectric pump 1. The actuator 3 moves away from the lower opposed wall 5B by being driven and each of a near-center region and a near-outer periphery region of the actuator 3 vertically vibrates with a vibration amplitude of about several micrometers to several ten micrometers, for example.

When the actuator 3 bends so as to be upwardly convex as shown in FIG. 3A, the gap between the actuator 3 and the lower opposed wall 5B increases in the vicinity of the center of the actuator 3. Thus, the fluid pressure is low in the vicinity of the center of the gap and, thus, the fluid tends to flow in through the flow path hole 6A and the vicinity of the outer periphery of the gap. However, the gap in the vicinity of the outer periphery of the gap is relatively small and the flow path resistance is high, and thus, inflow of the fluid through the flow path hole 6A is dominant.

When the actuator 3 bends so as to be downwardly convex as shown in FIG. 3B, the gap between the actuator 3 and the lower opposed wall 5B decreases in the vicinity of the center of the actuator 3. Thus, the fluid pressure becomes high in the vicinity of the center of the gap and, thus, the fluid tends to flow out through the flow path hole 6A and the vicinity of the outer periphery of the gap. However, the space in the vicinity of the outer periphery of the gap is relatively wide and the flow path resistance is low, and thus, outflow of the fluid through the vicinity of the outer periphery of the gap is dominant.

The action described above is repeated with the resonant frequency of a first-order mode of the actuator 3, for example, with a frequency of about 20 kHz. By so doing, the fluid pressure in the gap in the vicinity of the center of or in the vicinity of the outer periphery of the actuator 3 continuously varies with the flexural vibrations of the actuator 3, but on a time average basis, negative pressure always occurs in the vicinity of the center and positive pressure always occurs so as to counterbalance to the negative pressure. Because of this, the piezoelectric pump 1 sucks the fluid through the flow path hole 6A and discharges the fluid through the flow path hole 6B. It should be noted that in the piezoelectric pump 1, the flow path hole 6A may preferably be opened to the air to perform positive pressure action, or the flow path hole 6B may preferably be opened to the air to perform negative pressure action.

In addition, with this configuration, the average size of the gap between the actuator 3 and the lower opposed wall 5B varies depending on variation of the pump load. In other words, in a state in which the pump load is high, the pressure in the space located on a side of the actuator 3 opposite to the lower opposed wall 5B becomes high, and thus, the average size of the gap between the actuator 3 and the lower opposed wall 5B is reduced such that the spring force of the elastic support portion 4 is balanced out. On the other hand, in a state in which the pump load is low, the pressure in the space located on the side of the actuator 3 opposite to the lower opposed wall 5B becomes low, and thus, the average size of the gap between the actuator 3 and the lower opposed wall 5B is increased such that the spring force of the elastic support portion 4 is balanced out. Therefore, the size of the gap is autonomously adjusted in response to variation of the pump load.

Figure 4:
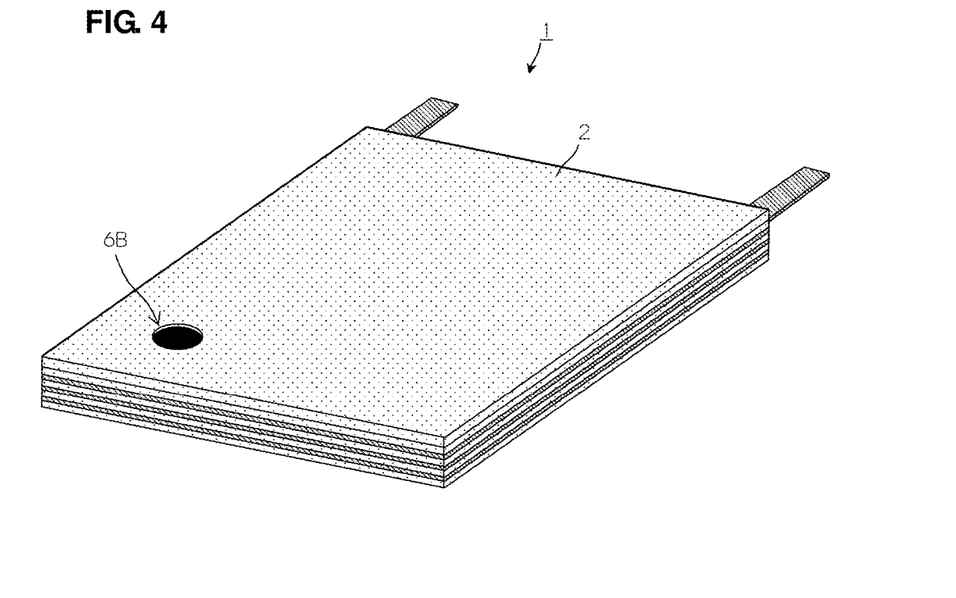
FIG. 4 is a perspective view of the piezoelectric pump shown in FIG. 2.

Next, a specific example of a configuration of the piezoelectric pump 1 will be described. FIG. 4 is a perspective view of the piezoelectric pump 1. The piezoelectric pump 1 includes a plurality of plate-shaped members that are laminated to one another, a flow path hole 6B to discharge fluid in an upper surface thereof, and a very small height preferably having an overall thickness dimension of, for example, about 1 mm.

Figure 5:
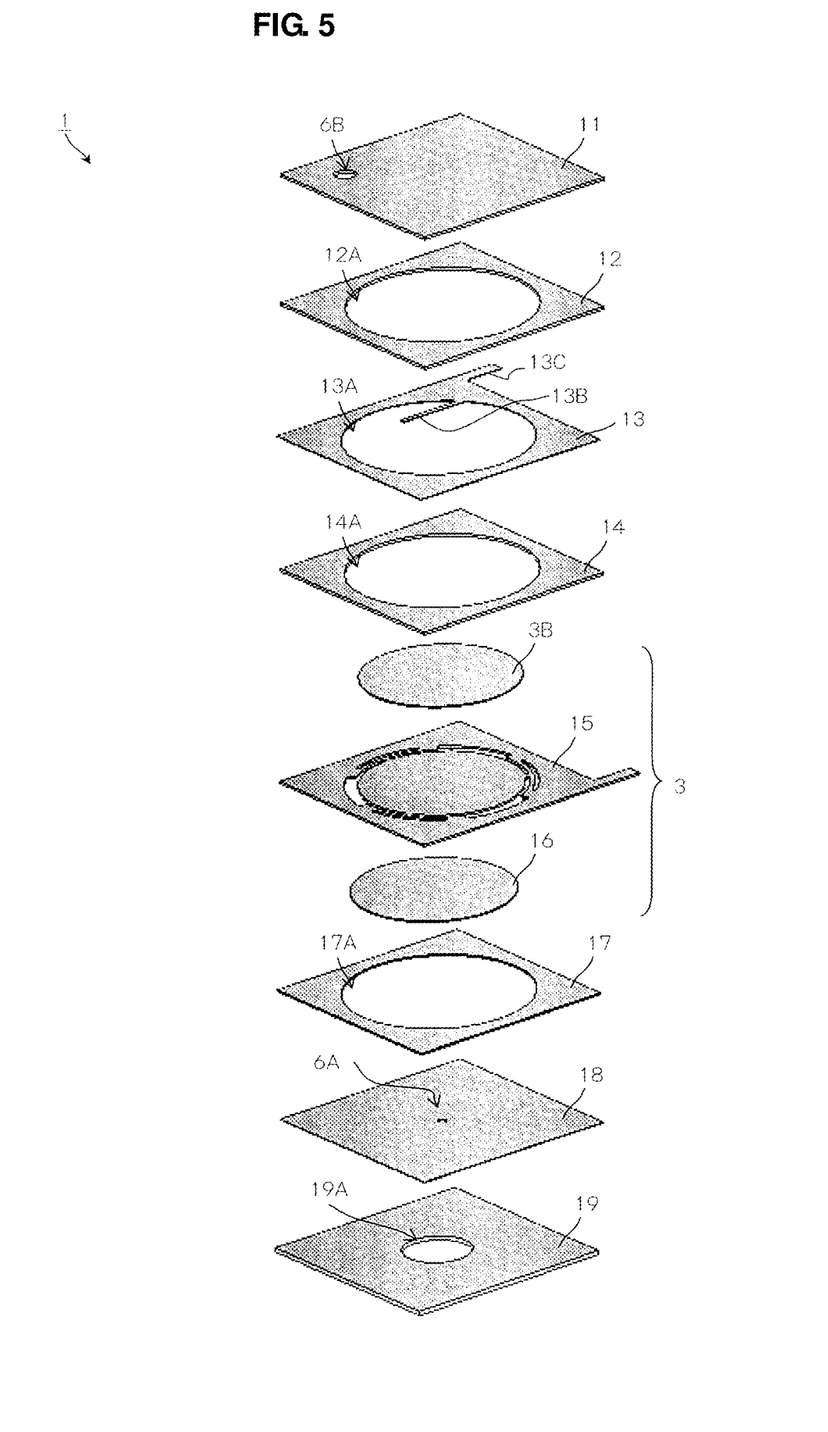
FIG. 5 is an exploded perspective view of the piezoelectric pump shown in FIG. 2.

FIG. 5 is an exploded perspective view of the piezoelectric pump 1. The piezoelectric pump 1 includes a housing top plate 11, a spacer 12, a power-supply plate 13, an insulating spacer 14, the piezoelectric element 3B, a leaf spring 15, a reinforcing plate 16, a spacer 17, a thin metal plate 18, and a frame plate 19 arranged in this order from the upper surface side.

In this example, a portion of the leaf spring 15 defines the vibration plate 3A, the piezoelectric element 3B is connected to the upper surface of portion, and the reinforcing plate 16 is connected to the lower surface of the portion, to define the actuator 3. The reinforcing plate 16 is provided to enhance the rigidity and adjust the resonant frequency of the actuator 3.

It should be noted that in the actuator 3 having the configuration described above, the members may preferably be connected to each other using a thermosetting adhesive, for example, and in such a case, warpage may occur in the actuator 3 due to the differences in coefficient of linear expansion between the members. In order to prevent such warpage, the coefficient of linear expansion of each of the leaf spring 15, the piezoelectric element 3B, and the reinforcing plate 16 is preferably selected such that thermal stress at the upper surface of the leaf spring 15 and thermal stress at the lower surface of the leaf spring 15 are balanced or substantially equal to one another. In addition, if compressive stress is designed to be applied to the piezoelectric element 3B after the joining, the shock resistance of the piezoelectric element 3B can be improved so as to make the piezoelectric element 3B difficult to break. For this purpose, a material having a sufficiently higher coefficient of linear expansion than coefficients of linear expansion of the piezoelectric element 3B and the reinforcing plate 16 is preferably used for the leaf spring 15. For example, phosphor bronze, German silver, or nickel silver, or other suitable material, having a high coefficient of linear expansion, is preferably used for the leaf spring 15, and SUS430, which has a relatively low coefficient of linear expansion, is preferably used for the reinforcing plate 16.

Figure 6:
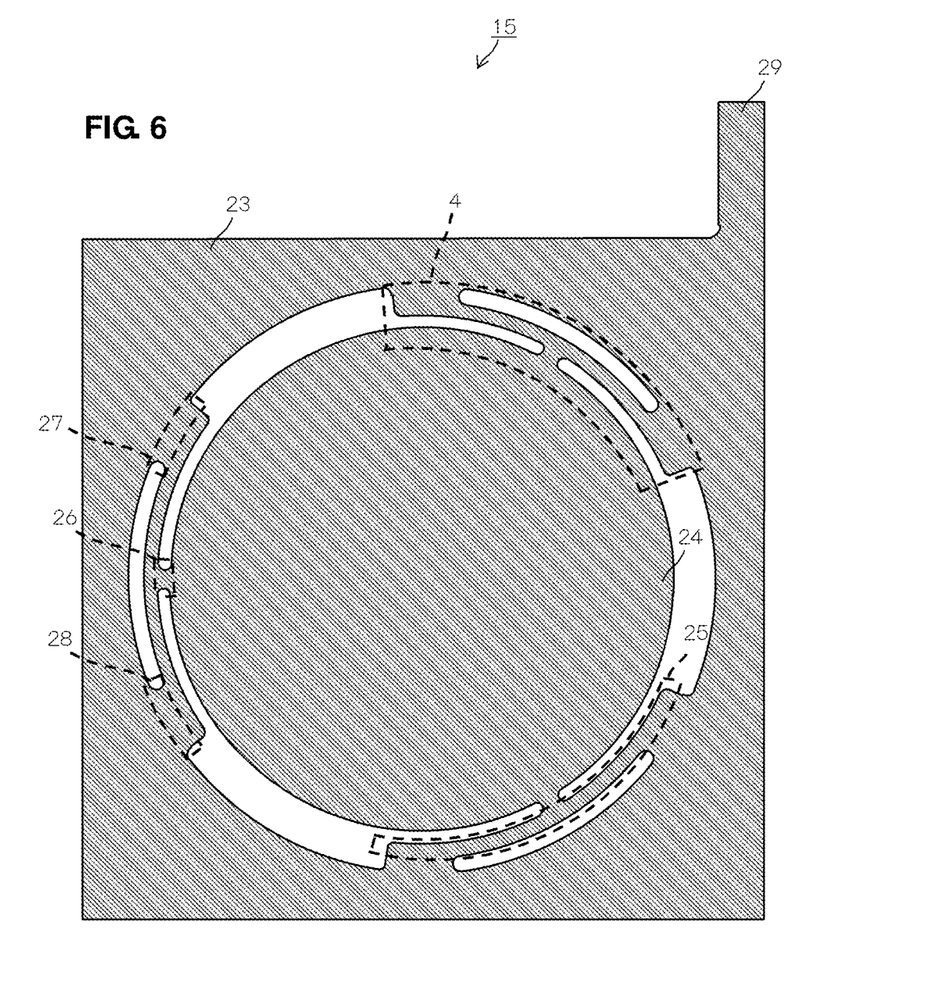
FIG. 6 is a plan view of a leaf spring shown in FIG. 5.

FIG. 6 is a plan view of the leaf spring 15. The leaf spring 15 is preferably a rectangular or substantially rectangular plate made of metal and includes three elastic support portions 4, an outer frame portion 23, a disc portion 24, and an external connection terminal 29, for example. It should be noted that the external connection terminal 29 projects outwardly from a corner in an outer periphery and is connected to a drive circuit, and a drive voltage to drive the piezoelectric element 3B is applied thereto.

The outer frame portion 23 preferably includes a circular or substantially circular opening surrounding the circumference of the disc portion 24 and defines a portion of the housing 2. The disc portion 24 preferably has a circular or substantially circular shape and defines the actuator 3 together with the reinforcing plate 16 and the piezoelectric element 3B as described above. It should be noted that the actuator 3 is preferably designed to have a natural vibration frequency of about 20 kHz, for example, and is driven to resonate and flexurally vibrates when a drive voltage of the same or substantially the same frequency as this frequency is applied to the piezoelectric element 3B. The three elastic support portions 4 are provided in a gap (slit) between the outer frame portion 23 and the disc portion 24 preferably at intervals of about 120°, for example.

Each elastic support portion 4 includes a beam portion 25 and connection portions 26, 27, and 28. The beam portion 25 extends in the gap between the outer frame portion 23 and the disc portion 24 along the outer circumference of the disc portion 24, is connected at both ends thereof to the outer frame portion 23 via the connection portions 27 and 28, and is connected at a center portion thereof to the disc portion 24 via the connection portion 26. The beam portion 25 includes a double-supported structure provided by the connection portions 27 and 28. With the elastic support portions 4 having such configurations, the disc portion 24 and the actuator 3 are elastically supported by the outer frame portion 23 and the housing 2.

When the disc portion 24 is connected to the outer frame portion 23 via the elastic support portions 4 as described above, a state in which the outer circumference of the disc portion 24 is not substantially restrained, namely, a state in which the actuator 3 is not substantially restrained by the housing 2, is provided. This allows the actuator 3 to flexurally vibrate such that the interval between the space of the outer periphery of the actuator 3 and the lower opposed wall 5B changes as shown in FIGS. 3A and 3B. Accordingly, during driving, by the fluid pressure, the actuator 3 moves upward away from the lower opposed wall 5B and freely vibrates in a non-contact state with respect to the lower opposed wall 5B. A desired vibration amplitude of the actuator 3 is ensured, and high pressure and a high flow rate are obtained even with a small-size and low-height structure. In addition, even when the frequency of the flexural vibrations of the actuator 3 is increased such that the actuator 3 is driven in a non-audible range of about 20 kHz or higher, a sufficient vibration amplitude is obtained and a desired flow rate and fluid pressure are ensured.

In addition, as shown in FIG. 6, each elastic support portion 4 is preferably configured to include the beam portion 25 extending in the slit between the outer frame portion 23 and the disc portion 24 along the outer circumference of the disc portion 24, and the beam portion 25 may be configured to have a wide range of lengths without substantially reducing the size (in area) of the disc portion 24. Therefore, each elastic support portion 4 has high flexibility in setting its resonant frequency (natural vibration frequency), and thus, enables the resonant frequency to be set so as to substantially correspond to the frequency of the flexural vibrations of the actuator 3, although it depends on the material and thickness of each member. Here, the dimensions of each elastic support portion 4 are preferably selected such that the resonant frequency (natural vibration frequency) thereof when the beam portion 25 and the connection portions 27 and 28 are removed is substantially equal to the resonant frequency (natural vibration frequency) of the actuator 3.

Figure 7:
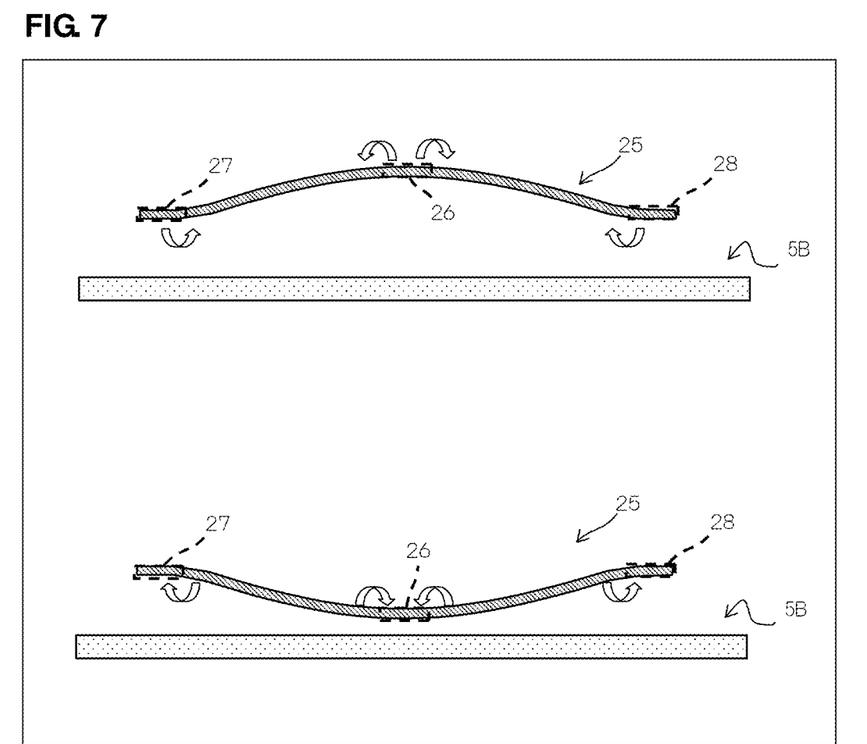
FIG. 7 is a schematic cross-sectional view illustrating deformation of the leaf spring shown in FIG. 5.

FIG. 7 is a schematic cross-sectional view illustrating a deformed state of the beam portion 25. When the resonant frequency of each elastic support portion 4 corresponds or substantially corresponds to the resonant frequency (the frequency of the flexural vibrations) of the actuator 3, vibrations in the first-order resonance mode in which the connection portion 26 to the actuator is the loop of the vibrations occur in the beam portion 25 with flexural vibrations of the actuator 3. In this case, the flexural vibrations of the actuator 3 are not damped by the beam portion 25, and the amplitude of the flexural vibrations of the actuator 3 is maximized.

In addition, in the beam portion 25, a moment load is applied to the connection portions 26, 27, and 28, which are connected to other members, in the directions indicated by arrows in the drawing. The lengths of the respective connection portions 26, 27, and 28 in a direction connecting the actuator 3 and the side wall are selected such that breakage is not caused by the moment load. It should be noted that the beam portion 25 preferably has an arc shape in a top view and is not folded back in a middle portion thereof. In a folded-back shape (i.e., a meandering shape, for example), a moment load is applied to a folded-back portion so as to open the folded-back portion in opposite vertical directions, and thus the elastic support portion has a high risk of breakage. However, the piezoelectric pump 1, in which none of the beam portions 25 include a folded-back portion as in the present preferred embodiment, has a configuration in which the elastic support portion is difficult to break and breakdown is unlikely to occur.

Even when the vibration mode of the beam portion 25 is an odd number-order resonance mode other than the first-order resonance mode, such as the third-order resonance mode, damping of the flexural vibrations of the actuator 3 by the beam portion 25 is effectively prevented or minimized. However, in a high-order resonance mode, the vibration amplitude of the beam portion 25 is reduced, and thus, vibrations in the first-order resonance mode are preferable.

In the present preferred embodiment, the elastic support portions 4 are preferably provided at three positions. However, the elastic support portions 4 need only be provided in at least two positions, and the elastic support portions 4 may be provided in more than three positions, for example.

The leaf spring 15 having such a configuration enables the amplitude of the flexural vibrations of the actuator 3 to be increased such that desired fluid pressure and flow rate can be efficiently obtained in the piezoelectric pump 1 even when the drive voltage is relatively low.

Referring back to FIG. 5, the configuration of each of the other members will be described.

The housing top plate 11, the spacer 12, the power-supply plate 13, and the insulating spacer 14 define a housing on the upper surface side of the actuator 3, and openings 12A, 13A, and 14A provided in these members define an inner space on the upper surface side of the actuator 3.

The housing top plate 11 is preferably a rectangular or substantially rectangular plate in which the flow path hole 6B is provided. The housing top plate 11 is preferably made of metal or resin, for example. The flow path hole 6B is a discharge hole that releases positive pressure within the housing and may be provided in any position in the housing top plate 11 but is preferably provided in a position spaced away from the center of the housing top plate 11 in the present preferred embodiment.

The spacer 12 is preferably a rectangular or substantially rectangular plate made of resin, for example, in which the opening 12A is provided, and is provided between the housing top plate 11 and the power-supply plate 13. The power-supply plate 13 preferably is a rectangular or substantially rectangular plate made of metal, for example, in which the opening 13A is provided, and includes a power-supply terminal 13B projecting inwardly in the opening 13A and an external connection terminal 13C projecting outwardly from a corner in the outer periphery. The power-supply terminal 13B is connected to an upper-surface electrode of the piezoelectric element 3B via soldering or other suitable method, and the external connection terminal 13C is connected to a drive circuit. The insulating spacer 14 is preferably a rectangular or substantially rectangular plate made of resin, for example, in which the opening 14A is provided, and functions to insulate the power-supply plate 13 and the leaf spring 15 from each other.

The thickness of the insulating spacer 14 is preferably slightly larger than the thickness of the piezoelectric element 3B, and the soldered position of the power-supply terminal 13B is arranged at a position corresponding to the node of the flexural vibrations of the actuator 3. Thus, the power-supply terminal 13B does not substantially vibrate with the flexural vibrations of the actuator 3. Accordingly, damping of the flexural vibrations of the actuator 3 by the power-supply terminal 13B is prevented. In addition, the thickness of the spacer 12 is preferably set to a thickness such that even when the actuator 3 flexurally vibrates, the power-supply terminal 13B does not come into contact with the housing top plate 11 and a sufficient interval is maintained therebetween. If the housing top plate 11 gets very close to the actuator 3, there is risk that the vibration amplitude of the actuator 3 will be decreased due to the flow path resistance. Thus, by maintaining the sufficient interval, a decrease in the vibration amplitude of the actuator 3 is prevented. With this configuration, the thickness of the spacer 12 is preferably substantially the same as that of the piezoelectric element 3B.

In addition, the spacer 17, the thin metal plate 18, and the frame plate 19 define a housing on the lower surface side of the actuator 3, and an opening 17A provided in the spacer 17 defines an inner space on the lower surface side of the actuator 3.

The spacer 17 is preferably a rectangular or substantially rectangular plate in which the opening 17A is provided, and is configured to ensure a space to accommodate the reinforcing plate 16. The thin metal plate 18 is preferably a rectangular or substantially rectangular plate made of metal, for example, in which the flow path hole 6A is provided, and defines the lower opposed wall 5B described with reference to FIG. 2. The frame plate 19 is preferably a rectangular or substantially rectangular plate made of metal, for example, in which an opening 19A is provided, and is configured to include a thin portion and a thick portion in the lower opposed wall 5B.

Here, the thickness of the spacer 17 is preferably slightly larger than the thickness of the reinforcing plate 16 (by, for example, about 20 μm), and thus, the lower surface of the actuator 3 (the lower surface of the reinforcing plate 16) faces the upper surface of the thin metal plate 18 (the lower opposed wall 5B) with a small gap therebetween. The gap is automatically adjusted in response to load variations. When the load is low, the gap increases and the flow rate increases, and when the load is high, the elastic support portions 4 sag to decrease the gap, and required fluid pressure is ensured.

In addition, by connecting the frame plate 19 to the thin metal plate 18, the thin portion and the thick portion are provided in the lower opposed wall 5B. In this configuration, the thin portion is preferably set such that its resonant frequency is substantially the same as or slightly lower than that of the actuator 3. Thus, the thin portion flexurally vibrates in response to pressure variation caused by vibrations of the actuator 3, such that its vibration phase shifts from the vibration phase of the actuator 3 (for example, a delay of about) 90°), and thus, it is possible to substantially increase the vibration amplitude in the interval between the actuator 3 and the lower opposed wall 5B in order to further improve the pumping power. The thin metal plate 18 and the frame plate 19 may preferably be made of resin, instead of metal, for example. However, in the present preferred embodiment, the thin metal plate 18 and the frame plate 19 are made of metal in order to achieve a resonant frequency that is substantially the same as that of the actuator 3.

Next, a result of a sample test conducted using the piezoelectric pump 1 having the configuration described above will be described with reference to FIG. 8. A sample A is a comparative sample in which the natural vibration frequency of the spring portion is intentionally shifted from the natural vibration frequency of the actuator. Specifically, in the sample A, the material of the leaf spring is phosphor bronze (C5210), the designed value of the natural vibration frequency of each elastic support portion is set to about 17.4 kHz, and the natural vibration frequency of the actuator is set to about 20 kHz, for example. Meanwhile, in a sample B, the material of the leaf spring is German silver (C7701), the designed value of the natural vibration frequency of each elastic support portion is set to about 19.8 kHz, and the natural vibration frequency of the actuator is set to about 20 kHz, for example.

Figure 8:
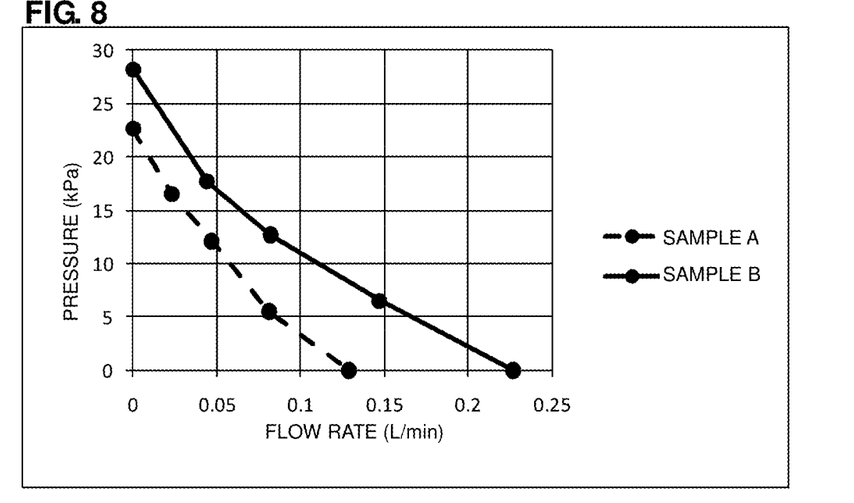
FIG. 8 is a diagram showing fluid pressure-flow rate characteristics of the piezoelectric pump.

In such a sample test, it was confirmed that in the sample B in which the natural vibration frequency of each elastic support portion is substantially equal to the natural vibration frequency of the actuator, the obtained fluid pressure and flow rate are greater than in the sample A in which the natural vibration frequency of each elastic support portion is different from the natural vibration frequency of the actuator, as shown in FIG. 8. This is because damping of flexural vibrations by each elastic support portion is prevented or minimized.

Next, a configuration of another example of the leaf spring according to a preferred embodiment of the present invention will be described.

Figure 9:
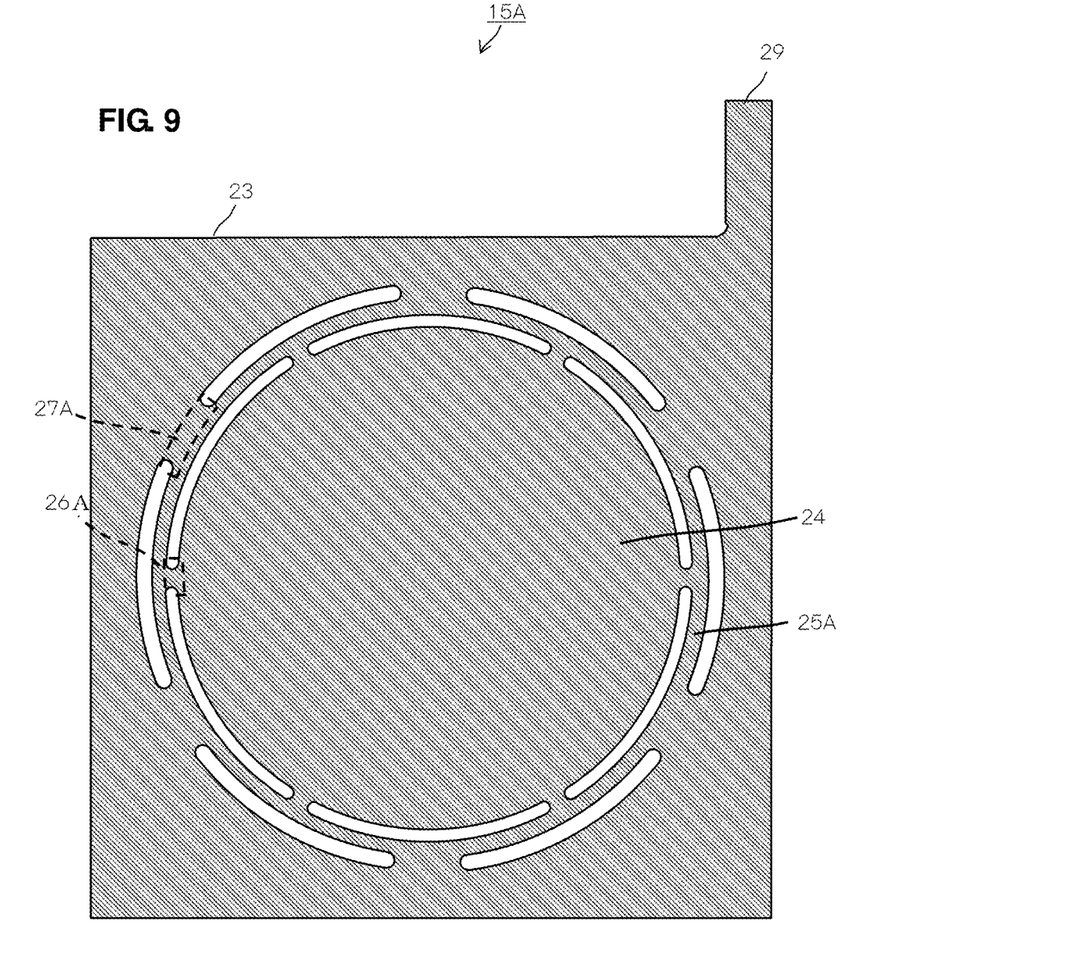
FIG. 9 is a plan view according to another example of a configuration of the leaf spring shown in FIG. 5.

FIG. 9 is a plan view of a leaf spring 15A according to the other example. The leaf spring 15 includes three separately provided elastic support portions 4, whereas the leaf spring 15A is configured to include an annular beam portion 25A, six side wall connection portions 27A preferably arranged at intervals of about 60°, for example, and six actuator connection portions 26A arranged so as to be shifted from the side wall connection portions 27A preferably by about 30°, for example.

In the present preferred embodiment, when the resonant frequency (natural vibration frequency) of the elastic support portion substantially corresponds with the resonant frequency (natural vibration frequency) of the actuator and the elastic support portion vibrates in the first-order resonance mode or in a higher odd number-order resonance mode, flexural vibrations of the actuator are prevented from being damped. It should be noted that the resonant frequency (natural vibration frequency) of the elastic support portion is not limited to exactly corresponding to the resonant frequency (natural vibration frequency) of the actuator, and may be slightly shifted therefrom in a range in which the advantageous effects are provided.

Second Preferred Embodiment

Next, a piezoelectric pump 51 according to a second preferred embodiment of the present invention will be described.

Figure 10:
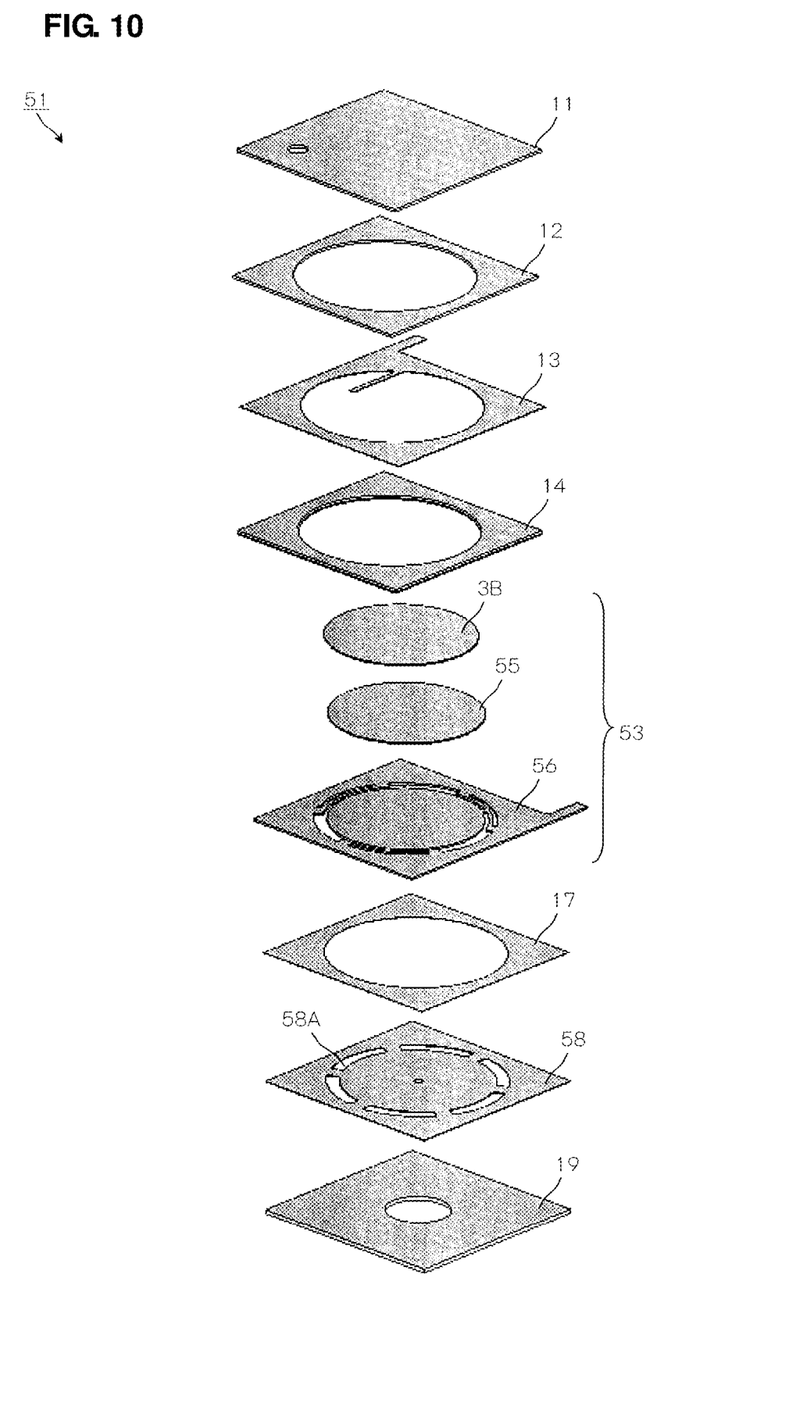
FIG. 10 is an exploded perspective view of a piezoelectric pump according to a second preferred embodiment of the present invention.

FIG. 10 is an exploded perspective view of the piezoelectric pump 51. The piezoelectric pump 51 includes an actuator 53 and a thin metal plate 58 each of which has a different configuration from that in the first preferred embodiment of the present invention described above.

The actuator 53 includes a piezoelectric element 3B, a reinforcing plate 55, a leaf spring 56, and a reinforcing plate 55 that are laminated in a middle portion thereof. In this case, it is necessary to appropriately reset the coefficient of linear expansion of each member, and it is preferable that a material having a sufficiently higher coefficient of linear expansion than those of the piezoelectric element 3B and the leaf spring 56 is used for the reinforcing plate 55. Preferably, for example, phosphor bronze, German silver, or other suitable material having a high coefficient of linear expansion is used for the reinforcing plate 55, and SUS430 or other suitable material having a low coefficient of linear expansion is used for the leaf spring. In this case, the Young's modulus of the leaf spring is higher than those of phosphor bronze and German silver, and thus, the spring constant and the natural vibration frequency of the leaf spring are too high when the leaf spring has the same spring shape as in the first preferred embodiment. Therefore, in the present preferred embodiment, the natural vibration frequency is reduced preferably by changing the shape of the leaf spring, such as by increasing the length of the slit portion so as to be greater than the length of the slit portion in the first preferred embodiment.

In addition, in the present preferred embodiment, in the thin metal plate 58, relief holes 58A are provided in positions that face the elastic support portions of the leaf spring 56. The relief holes 58A prevent interference between the leaf spring 56 and the thin metal plate 58. With the configuration of preferred embodiments of the present invention, the elastic support portions vibrate in response to vibrations of the actuator, and in each elastic support portion, the vicinity of the connection portion to the actuator has the highest vibration amplitude. Although there is no problem in the first preferred embodiment, when the reinforcing plate and the piezoelectric element are provided on the leaf spring as in the present preferred embodiment, the interval between the leaf spring 56 and the thin metal plate 58 is only about 20 µm, for example, and there is a possibility that the elastic support portion will come into contact with the thin metal plate 58 during driving. Contact between the elastic support portion and the thin metal plate 58 is problematic since it deteriorates the pressure-flow rate characteristic and causes unusual noise. Thus, by providing the relief holes 58A in the portions of the thin metal plate 58 that face the elastic support portions, interference between the elastic support portions and the thin metal plate 58 is prevented. It should be noted that a lifting effect by flow path resistance is exerted in the vicinity of the center portion of the actuator, and thus, contact with the thin metal plate 58 is unlikely to occur, which causes no problem.

The relief holes are preferably provided in six positions in the present preferred embodiments so as to support leaf springs having various shapes. However, when three elastic support portions are provided as in the present preferred embodiment, relief holes may merely be provided in the three corresponding positions, respectively.

In each of the preferred embodiments described above, a unimorph type actuator preferably is provided in which the piezoelectric element is disposed on a single surface of the leaf spring. However, a bimorph type actuator may be provided in which piezoelectric elements are disposed on both surfaces of a leaf spring.

In addition, the actuator is not limited to the type including the piezoelectric element, and one that is driven by an electromagnetic drive may be used as long as it flexurally vibrates.

In addition, the sizes of the piezoelectric element and the disc portion may be the same, or the disc portion may be larger than the piezoelectric element.

In addition, in preferred embodiments of the present invention, in applications in which occurrence of audible sound is not problematic, the actuator may be driven in an audible frequency band.

In addition, the configuration is not limited to the configuration in which one flow path hole 6A is provided, and a plurality of flow path holes 6A may be provided in a region that faces the actuator.

In addition, in each of the preferred embodiments described above, the frequency of the drive voltage preferably is set such that the actuator vibrates in the first-order mode. However, the frequency of the drive voltage may be set such that the actuator vibrates in another mode, such as the third-order mode.

In addition, in each of the preferred embodiments described above, the disc-shaped piezoelectric element and the disc-shaped vibration plate are preferably provided. However, one of the piezoelectric element and the vibration plate may be rectangular or polygonal.

It should be noted that the fluid to be sucked or sucked and discharged is not limited to a gas and may be a liquid.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An actuator structure comprising:
   an actuator arranged to flexurally vibrate;
   a side wall surrounding an outer periphery of the actuator; and
   a plurality of elastic support portions elastically supporting the outer periphery of the actuator to the side wall, the plurality of elastic support portions being separately provided and spaced apart from one another around the outer periphery of the actuator; wherein
   the actuator includes a piezoelectric element configured to vibrate the actuator;
   the actuator includes a solid contiguous body;
   each of the plurality of elastic support portions includes:
     a beam portion extending in a gap between the actuator and the side wall in a direction along the outer periphery of the actuator;
     an actuator connection portion connecting the beam portion to the actuator; and
     a side wall connection portion connecting the beam portion to the side wall at a position offset from the actuator connection portion in the direction along the outer periphery of the actuator; and
   the side wall connection portions extend outward in a direction from the respective beam portion towards the side wall and are directly connected to the side wall.

2. The actuator structure according to claim 1, wherein the beam portion has a shape that matches or corresponds to the outer periphery of the actuator.

3. The actuator structure according to claim 1, wherein the beam portion has an arc shape or substantially arc shape.

4. The actuator structure according to claim 1, wherein, in each of the plurality of elastic support portions, the side wall connection portion is connected to an end of the beam portion.

5. The actuator structure according to claim 1, wherein
each of the plurality of elastic support portions includes two of the side wall connection portions; and
in each of the plurality of elastic support portions, the actuator connection portion is located between the two side wall connection portions.

6. The actuator structure according to claim 1, wherein the beam portion is configured such that a beam portion length is provided without folding the beam portion.

7. The actuator structure according to claim 1, wherein the actuator has a disc shape.

8. A pump device comprising:
an actuator arranged to flexurally vibrate;
a housing including a side wall surrounding an outer periphery of the actuator and an opposed wall which is adjacent to and opposed to a principal surface of the actuator; and
a plurality of elastic support portions elastically supporting the outer periphery of the actuator on the side wall, the plurality of elastic support portions being separately provided and spaced apart from one another around the outer periphery of the actuator; wherein
the actuator includes a piezoelectric element configured to vibrate the actuator;
the actuator includes a solid contiguous body;
each of the plurality of elastic support portions includes:
a beam portion extending in a gap between the actuator and the side wall in a direction along the outer periphery of the actuator;
an actuator connection portion connecting the beam portion to the actuator; and
a side wall connection portion connecting the beam portion to the side wall at a position offset from the actuator connection portion in the direction along the outer periphery of the actuator; and
the side wall connection portions extend outward in a direction from the respective beam portion towards the side wall and are directly connected to the side wall.

9. The pump device according to claim 8, wherein the beam portion has a shape that matches or corresponds to the outer periphery of the actuator.

10. The pump device according to claim 8, wherein the beam portion has an arc shape or substantially arc shape.

11. The pump device according to claim 8, wherein, in each of the plurality of elastic support portions, the side wall connection portion is connected to an end of the beam portion.

12. The pump device according to claim 8, wherein
each of the plurality of elastic support portions includes two of the side wall connection portions; and
in each of the plurality of elastic support portions, the actuator connection portion is located between the two side wall connection portions.

13. The pump device according to claim 8, wherein the beam portion is configured such that a beam portion length is provided without folding the beam portion.

14. The pump device according to claim 8, wherein the actuator has a disc shape.

* * * * *